(12) United States Patent
Fablet et al.

(10) Patent No.: US 8,364,621 B2
(45) Date of Patent: Jan. 29, 2013

(54) METHOD AND DEVICE FOR CODING A STRUCTURED DOCUMENT AND METHOD AND DEVICE FOR DECODING A DOCUMENT SO CODED

(75) Inventors: Youenn Fablet, La Dominelais (FR); Romain Bellessort, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 787 days.

(21) Appl. No.: 12/466,758

(22) Filed: May 15, 2009

(65) Prior Publication Data

US 2009/0287625 A1 Nov. 19, 2009

(30) Foreign Application Priority Data

May 15, 2008 (FR) ...................................... 08 53159

(51) Int. Cl.
*G06F 17/21* (2006.01)
*G06F 17/22* (2006.01)
*G06F 17/27* (2006.01)

(52) U.S. Cl. .......................................... 706/45; 706/21

(58) Field of Classification Search ...................... 706/45
See application file for complete search history.

(56) References Cited

U.S. PATENT DOCUMENTS

| 2007/0276827 A1 | 11/2007 | Ruellan et al. | 707/6 |
| 2008/0250055 A1 | 10/2008 | Ruellan et al. | 707/102 |
| 2009/0138529 A1 | 5/2009 | Bellessort | 707/203 |
| 2009/0183067 A1 | 7/2009 | Fablet | 715/234 |

OTHER PUBLICATIONS

Peintner, Efficient XML Interchange (EXI) Primer W3C Working Draft Dec. 19, 2007 [online], 2007 [retrieved on Jan. 15, 2012]. Retrieved from the Internet< URL:http://www.w3.org/TR/2007/WD-exi-primer-20071219/>.*

"International Standard 24824-1, Information Technology—Generic applications of ASN.1—Fast Infoset", 10 pp. and Technical Corrigendum 1, 1 pg. (2007).

"XML Schema", W3C® Ubiquitous Web domain, >>http://www.w3.org/XML/Schema>>, 29 pp., printed Oct. 19, 2009.

"Branch predictor", <<http//en.wikipedia.org/wiki/Branch_prediction>>, 9 pp., printed Oct. 19, 2009.

Skibinsky, P., et al., "Variable-length contents for PPM", Proc. of the Data Compression Conference (DCC '04), , pp. 409-418, Mar. 23, 2004.

Toman, V., et al., "Syntactical Compression of XML Data", Advanced Information Systems Engineering, International Conference, pp. 1-12, Jun. 1, 2004.

Schneider, J., et al., "Efficient XML Interchange (EXI) Format 1.0", W3C Working Draft, Jul. 16, 2007.

Cleary, J.G., et al., "Unbounded Length Contexts for PPM", The Computer Journal, vol. 40, No. 2/3, pp. 67-75, Jan. 1, 1997.

Deutsch, P., "Deflate Compressed Data Format Specification Version 1.3", Internet Engineering Task Force, May 1996 http://www.ietf.org/rfc/rfc1951.txt.

* cited by examiner

*Primary Examiner* — Jeffrey A Gaffin
*Assistant Examiner* — Nathan Brown, Jr.
(74) *Attorney, Agent, or Firm* — Fitzpatrick, Cella, Harper & Scinto

(57) ABSTRACT

The method of coding a structured document comprises:
a step (705) of determining whether a succession of correct predictions exists for items of a set of items of the document and
if the result of said determining step is positive, a step (710) of coding the number of successive correct predictions.
In embodiments, this method further comprises, if a set of items of the document possesses associated values, a step of coding said values associated with said set of items of the document.

31 Claims, 8 Drawing Sheets

Figure 1:
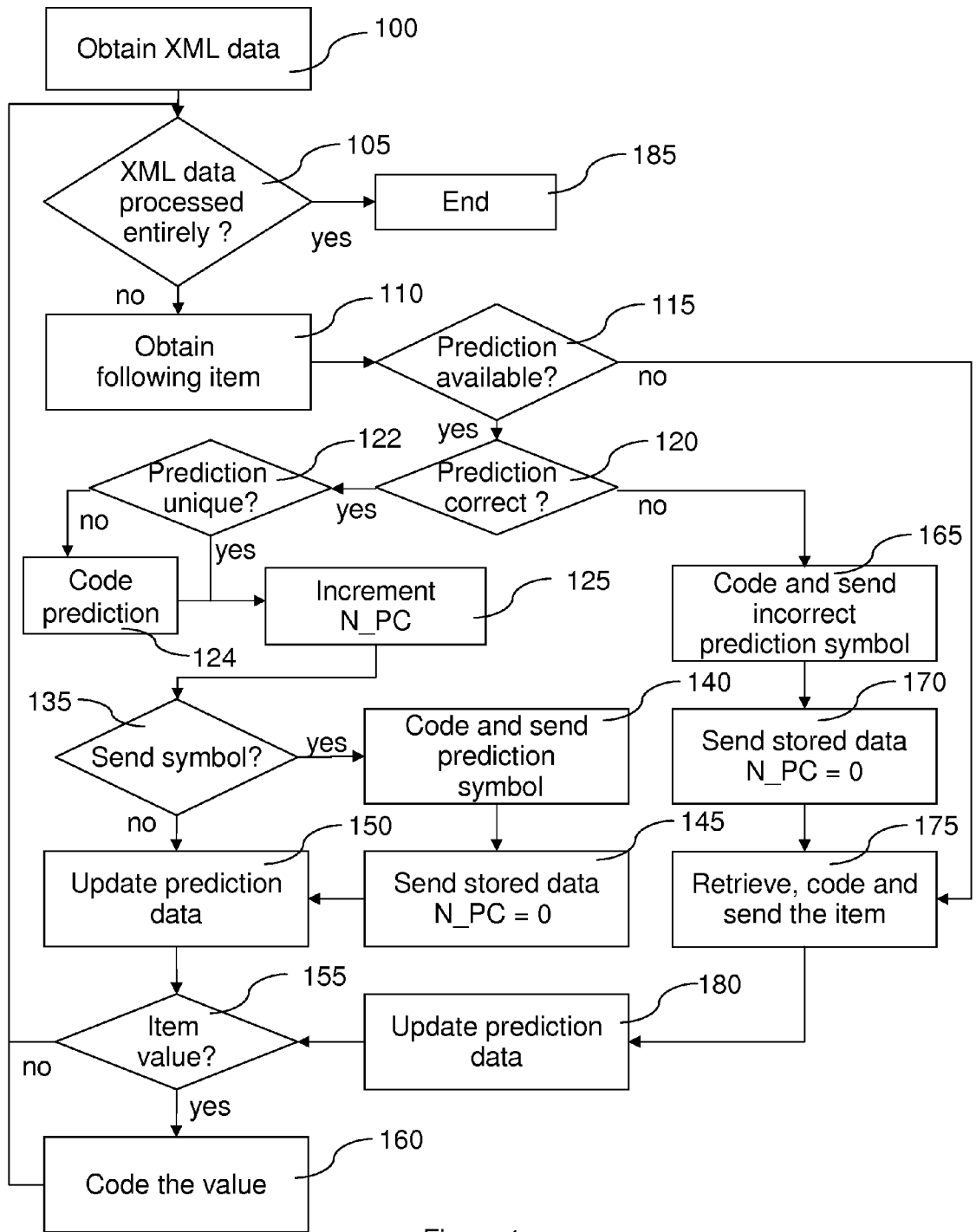

METHOD AND DEVICE FOR CODING A STRUCTURED DOCUMENT AND METHOD AND DEVICE FOR DECODING A DOCUMENT SO CODED

The present invention concerns a method and a device for coding a structured document and a method and a device for decoding a document so coded. It applies, in particular, to the coding of a document described in markup language, in particular the XML language (XML being an acronym for "Extensible Markup Language").

XML is a syntax for defining computer languages. XML makes it possible to create languages that are adapted for different uses but which may be processed by the same tools.

An XML document is composed of elements, each element starting with an opening tag comprising the name of the element (for example: <tag>) and ending with a closing tag which also comprises the name of the element (for example </tag>). Each element can contain other elements or text data.

Furthermore, an element may be specified by attributes, each attribute being defined by a name and having a value. The attributes are placed in the opening tag of the element they specify (for example <tag attribute="value">).

XML syntax also makes it possible to define comments (for example "<!--Comment-->") and processing instructions, which may specify to a computer application what processing operations to apply to the XML document (for example "<?myprocessing?>").»).

It is considered below that XML data are described in terms of items, it being possible for each item to be a start element (<tag>), an end element (</tag>), an attribute, a text content, a comment or a processing instruction.

Several different XML languages may contain elements of the same name. To be able to mix several different XML languages, an addition has been made to XML syntax making it possible to define "Namespaces". Two elements are identical only if they have the same name and are situated in the same namespace. A namespace is defined by a URI (acronym for Uniform Resource Identifier), for example "http://canon.crf.fr/xml/mylanguage". The use of a namespace in an XML document is via the definition of a prefix which is a shortcut to the URI of that namespace. This prefix is defined using a specific attribute (for example "xmlns:ml="http://canon.crf.fr/xml/mylanguage" associates the prefix "ml" with the URI "http://canon.crf.fr/xml/mylanguage"). Next, the namespace of an element or of an attribute is specified by having its name preceded by the prefix associated with the namespace followed by ':' (for example '<ml:tag ml:attribute="value">').

XML has numerous advantages and has become a standard for storing data in a file or for exchanging data. XML makes it possible in particular to have numerous tools for processing the files generated. Furthermore, an XML document may be manually edited with a simple text editor. Moreover, as an XML document contains its structure integrated with the data, such a document is very readable even without knowing the specification.

The main drawback of the XML syntax is to be very prolix. Thus the size of an XML document may be several times greater than the inherent size of the data. This large size of XML documents thus leads to a long processing time when XML documents are generated and especially when they are read.

To mitigate these drawbacks, methods for coding an XML document have been sought. The object of these methods is to code the content of the XML document in a more compact form, but enabling the XML document to be easily reconstructed. However, most of these methods do not maintain all the advantages of the XML format.

Among these methods, the simplest consists of coding the structural data in a binary format instead of using a text format. Furthermore, the redundancy of the structural information in the XML format may be eliminated or at least reduced (for example, it is not necessarily useful to specify the name of the element in the opening tag and in the closing tag).

Another method is to use an index table, in particular for the names of elements and attributes which are generally repeated in an XML document. Thus, at the first occurrence of an element name, it is coded normally in the file and an index is associated with it. Then, for the following occurrences of that element name, the index is used instead of the complete string, which reduces the size of the document generated and makes it easier to read. More particularly, it is no longer necessary to read the entire string in the file and determining the element read may be performed by a comparison of integers instead of a comparison of strings.

Lastly, beyond these elementary methods, there are more highly developed methods consisting in particular of taking into account more structural information in order to further compress the data. The case of "Efficient XML" (registered trademark) may be cited, which is a format used as a basis for the standardization of a binary XML format by the EXI group of W3C (EXI being an acronym for "Efficient XML Interchange" and W3C being an acronym for world wide web consortium), which takes into account the order of appearance of the different items within a document to construct a grammar which makes it possible to code the most frequent items using a small number of bits.

Efficient XML uses a set of grammars to code an XML document. A grammar is composed of a set of productions, each production comprising an item description, or XML event, an associated coding value and the statement of the following grammar to use. To code an XML event using a grammar, the production containing the most precise description of the XML event is used. The coding value contained in that production is used to represent the event, and the information contained in the event and not described in the production is coded.

A grammar is upgradeable. In a certain number of cases, after the occurrence of an XML event already described by a production of the grammar, the grammar is modified to include a new production corresponding to that XML event. This production may either contain a more precise description of the event, reducing the number of pieces of information to code to represent the event, or have a more compact coding value.

The coding values are expressed in the form of priorities having from one to three levels. Coding a coding value amounts to coding the values of its priority. Each level is coded over a minimum number of bits to be able to code the highest value of that level associated with a production of the grammar.

To code an XML document, a set of grammars is used. A few grammars serve for coding the actual structure of the XML document. Furthermore, for each type of XML element present in the document (a type of XML element being a set of elements having the same name), a set of grammars is used to code the XML elements of that type.

The rules of grammars used may be generic rules, common to all the XML documents and constructed on the basis of the XML syntax. They may also be rules specific to a type of document, constructed on the basis of an XML schema (http://www.w3.org/XML/Schema) describing the structure of that type of document.

On decoding, the inverse process is used: the coding value is extracted and makes it possible to identify the coded XML event, as well as the complementary information to decode. In addition, on decoding, the same grammar evolution rules are used, making it possible at any time to have a set of grammar rules identical to that which was used on coding.

For example, the following XML fragment is used to describe the coding of an XML document using the Efficient XML specification.

```
<person>
    <firstName>John</firstName>
    <lastName>Smith</lastName>
</person>
```

As the coder has not encountered the "person" element previously, a grammar "by default" is created for that element. This is a grammar only containing generic productions. During the coding of the "person" element, new productions are inserted to render the grammar linked to the "person" element more effective. The grammar "by default" that is used to code the content of the "person" element is the following (in simplified manner relative to the Efficient XML specification):

| ElementContent: | | |
|---|---|---|
| EE | | 0 |
| SE (*) | ElementContent | 1.0 |
| CH | ElementContent | 1.1 |

"EE" corresponds to the end element event, "SE (*)" corresponds to some particular start element event (the name is not specified), and "CH" corresponds to a text content event.

On coding, after having received the event corresponding to the "person" start element, "SE (person)" and having coded it, the coder selects the coding grammar for the content of the "person" element, described above.

Next, the coder receives the event corresponding to the "firstname" start element, (SE (firstname)). The production which corresponds to that event in the above grammar is the second:

| | | |
|---|---|---|
| SE (*) | ElementContent | 1.0 |

The coder therefore codes the priority "1.0". As the first level of priority comprises two separate values ("0" and "1"), that level may be coded over one bit, with the value 1. Similarly, the second level of priority comprises two separate values and may be coded over one bit, with the value "0". The priority "1.0" is thus coded here with the two bits "10". Next, since the production does not specify the name of the element, "firstName" is coded.

The coding of the content of "firstName" is then continued. For this, the rule associated with that element is searched for. As no "firstName" element has been encountered, a "first-Name" grammar is created from the grammar by default. The "firstName" element contains a text node as its sole child.

Once this text node has been coded, the grammar of "first-Name" is updated by inserting a production text (CH):

| ElementContent: | | |
|---|---|---|
| Characters | | 0 |
| EE | | 1 |
| SE (*) | ElementContent | 2.0 |
| CH | ElementContent | 2.1 |

Once the content of "firstName" has been coded, the coder modifies the grammar associated with the "person" element to adapt the grammar to the XML data encountered. For this, a new production is added to the grammar, this production corresponding to the "firstName" start element. The priority "0" is associated with this production, and the other priorities are offset to maintain the uniqueness of the priorities. The grammar thus becomes:

| ElementContent: | | |
|---|---|---|
| SE (firstName) | ElementContent | 0 |
| EE | | 1 |
| SE (*) | ElementContent | 2.0 |
| CH | ElementContent | 2.1 |

The following event is the start of the element "lastName". As for "firstName", this element is coded using the production:

| | | |
|---|---|---|
| SE (*) | ElementContent | 2.0 |

As the first level of priority now has three possible values, it is coded over two bits, with the value "2". The second level of priority is still coded over a single bit. The priority "2.0" is thus coded here with the three bits "100". The name of the element, "lastName" is coded next. Next the content of "last-Name" is coded using the grammar associated with the element "lastName".

After this, the grammar is modified to add thereto a production corresponding to the start of the element "lastName" and it thus becomes:

| ElementContent: | | |
|---|---|---|
| SE (lastName) | ElementContent | 0 |
| SE (firstName) | ElementContent | 1 |
| EE | | 2 |
| SE (*) | ElementContent | 3.0 |
| CH | ElementContent | 3.1 |

If, further on in the document, the coder encounters another similar "person" element, that element is coded on the basis of that grammar.

Thus the first event corresponding to the content of the "person" element is the start event of the "firstName" element. This element is coded with the production:

| | | |
|---|---|---|
| SE (firstName) | ElementContent | 1 |
| The production | | |
| SE (*) | ElementContent | 3.0 | also corresponds to that event, but is less precise (it does not specify the name of the element). It is thus the first production which is used.

The coder thus codes the priority of this production, i.e. "1", which is coded with the two bits "01". There is no need to code the name of the element, since this is specified by the production. The coder next codes the content of the element "firstName".

As a production specific to the start event of the "firstName" element already exists in the grammar, it is not necessary to add a new production to the grammar.

The coder next codes the start event of the "lastName" element similarly, by solely coding the priority 0 with the two bits "00".

Thus, for the coding of the second "person" element similar to the first, the code generated is more compact, since it is no longer necessary to code the name of the elements contained in "person", either literally (by coding the entirety of the string), or even using an index.

If a schema is available to describe the content of "person", i.e. a "firstName" element and a "lastName" element, it is possible to construct, from the outset, the grammar generated after the end of the coding of the first "person" element.

However, if the schema furthermore specifies that the elements "firstName" and "lastName" must be put in order within the "person" element, "firstName" coming before "lastName", it is possible to generate the following grammars to describe the content of "person".

| ElementContent1: | | |
|---|---|---|
| SE (firstName) | ElementContent2 | 0 |
| EE | | 1 |
| SE (*) | ElementContent1 | 2.0 |
| CH | ElementContent1 | 2.1 |
| ElementContent2: | | |
| SE (lastName) | ElementContent3 | 0 |
| EE | | 1 |
| SE (*) | ElementContent2 | 2.0 |
| CH | ElementContent2 | 2.1 |
| ElementContent3: | | |
| EE | | 0 |
| SE (*) | ElementContent2 | 1.0 |
| CH | ElementContent2 | 1.1 |

These grammars use the known order of appearance of the elements "firstName" and "lastName" to separate the productions into several grammars and reduce the number of productions per grammar and, consequently, the number of bits necessary to code a priority.

These grammars may even be reduced if the deviations with respect to the schema are not accepted, and then becomes:

| ElementContent1: | | |
|---|---|---|
| SE (firstName) | ElementContent2 | 0 |
| ElementContent2: | | |
| SE (lastName) | ElementContent3 | 0 |
| ElementContent3: | | |
| EE | | 0 |

In this case, as each grammar only contains a single priority, this priority does not need to be coded. Thus the set of the events describing the content of the "person" element as described above is coded in 0 bits.

The "Fast Infoset" format, specified by the standard "ITU-T Rec. X.891|ISO/IEC 24824-1" enables a more compact representation of an XML document by using binary event codes and index tables.

In this format, the types of events are described in list form which uses binary codes of variable length. Fast Infoset intensively uses indexing techniques by creating tables for specific sets of XML information. These tables make it possible to code a given piece of information literally (UTF8 or UTF16 to be specified) the first time that this piece of information is encountered during coding. This information is then added to the table. Later, this information is detected in the table, the index is retrieved from the table and the value of that index is coded in place of the information. A certain number of indexing tables may thus be noted:

the prefixes and URIs which define the namespaces are indexed in two specific tables, the attribute values and text node values are indexed in two specific tables the attribute and element local names are indexed in a specific table, the qualified names (which group together prefix, URI and local name) of elements and the qualified names of attributes are indexed in two specific tables.

It is to be noted that the Fast Infoset standard enables the coder to decide whether a particular attribute or text node value is to be indexed. This in particular avoids requiring a high memory space used by the coder. The decision whether or not to index an attribute value or a text node is thus coded in the Fast Infoset stream to enable the decoder to index or not index the decoded values.

The patent application US20070276827 presents a method for compressing hierarchized data, in particular XML data. The principle is to determine whether an XML element corresponds to a particular prediction or model. If this is the case, coding of that element is carried out. It may be noted that determining the match of an XML element to a model requires the XML element to be known in full, which requires storing the XML data in memory prior to coding. This principle is acceptable in certain utilizations, in particular when the data are already present in the form of a tree in memory. Nevertheless, in numerous cases of use, the XML data are in the form of a stream of events, in which case the coder must store these data. This additional step address a cost in terms of consumption of memory and processing time that is often prohibitive. It may moreover be noted that matching at the level of the XML element, which is often efficient, may prove too restrictive: little or no account is taken of the redundancy of sub-parts of elements which repeat, which has a negative impact on the compression rates obtained by these techniques.

The present invention aims to mitigate these drawbacks.

To that end, according to a first aspect, the present invention is directed to a method of coding a structured document, that comprises:

a step of determining whether a succession of correct predictions exists for items of a set of items of the document and if the result of said determining step is positive, a step of coding the number of successive correct predictions.

At the base of the present invention, the inventors have determined that the structures of the XML elements have a tendency to repeat. The implementation of the present invention takes advantage of this potential redundancy to better use the grammars and more compactly compress the elements which are already described by a grammar.

Thus, the prediction conformity relative to each item has been studied, by comparison between the item expected by prediction and the item obtained. Moreover, instead of coding a conformity bit for each conformity evaluation, the number of successive correct predictions is coded. For example, it ten successive items are correctly predicted, the decimal number "10" is coded (for which four bits are necessary), instead of coding one conformity bit ten times.

The implementation of the present invention enables gains to be obtained in terms of compression since there is a finer management of the predictions. It also provides gains in terms of performance, speed and memory, by optimizing the use of the latter and by facilitating the coding of each correctly predicted item. It also provides savings in terms of library size on account of the low complexity and low code size cost increase relative to the basic format, for example EXI or Fast Infoset.

According to particular features, during the step of determining whether a succession of correct predictions exists, for each item of said set of items, there is carried out:

a step of determining whether at least one applicable prediction exists and if yes, a step of determining whether a said applicable prediction is correct.

According to particular features, for each item of said set of items, if at least one applicable prediction exists and if no applicable prediction is correct, the structure of said item is coded, the number of successive correct predictions is coded and the number of successive correct predictions is reinitialized.

According to particular features, for each item of said set of items, if no applicable prediction exists, the structure of said item is coded without reinitializing the number of successive correct predictions.

According to a second aspect, the present invention is directed to a method of coding a structured document comprising a set of items, the method comprising:

determining available predictions for the productions associated with the items of the set of items;

for the items for which there exist at least one available prediction, determining whether at least one available prediction is correct;

determining a number of successive correct predictions, wherein the items associated to the productions corresponding to said successive correct predictions may not be successive; and coding the number of successive correct predictions.

According to particular features, the method of the second aspect of the present invention further comprises coding the structure of each item of said set of items associated to a production for which a prediction is available and is not correct.

According to particular features, the method of the second aspect of the present invention further comprises coding together the structure of each item of said set of items associated to a production for which a prediction is available and is not correct and the number of successive correct predictions.

According to particular features, the method of the second aspect of the present invention further comprises coding the structure of each item of said set of items associated to a production for which no prediction is available, and continuing the determination of the number of successive correct predictions as if said item did not exist.

According to particular features of the methods of both the first and second aspects of the present invention, during the step of determining whether at least one applicable prediction exists, for each item of said set of items, use is made, for a production corresponding to said item, of a number of correct predictions and a number of incorrect predictions, and if the number of incorrect predictions for said production is greater than a predetermined value, which may be a function of the number of correct predictions for said production, said prediction is modified.

According to particular features of the methods of both the first and second aspects of the present invention, during the step of determining whether at least one applicable prediction exists, for each item of said set of items, use is made, for a production corresponding to said item, of a number of correct predictions and a number of incorrect predictions, and if the number of incorrect predictions for said production is greater than a predetermined value, which may be a function of the number of correct predictions for said production, no applicable prediction exists for said item.

According to particular features of the methods of both the first and second aspects of the present invention, for each item of said set of items, if a plurality of applicable predictions exists and if one of the applicable predictions is correct, an identifier of the correct applicable prediction is coded.

According to particular features of the methods of both the first and second aspects of the present invention, during the step of determining whether a succession of correct predictions exists for items of said set of items of the document, use is made of at least one invariable prediction for said items of the set of the items of said part of the set of items of the document.

According to particular features of the methods of both the first and second aspects of the present invention, the method of the present invention, as succinctly set forth above, comprises a step of updating at least one prediction on the basis of the items of the document.

The predictions are thus more adapted to the document.

By virtue of each of these provisions, the number of items coded via the number of successive correct predictions is increased.

According to particular features of the methods of both the first and second aspects of the present invention, the method of the present invention, as succinctly set forth above, further comprises, if a part of the items of the set of items of the document possesses associated values, a step of coding said values associated with the set of items of the document.

This coding is efficient since the associated values are more rarely correctly predicted than the structures of the elements, in particular XML.

According to particular features of the methods of both the first and second aspects of the present invention, during the step of coding associated values, a step is implemented of storing, in memory, the values associated with said part of the set of items of the document.

According to particular features of the methods of both the first and second aspects of the present invention, during the coding step, for each correct prediction, pieces of information which are not predicted are coded and stored in a buffer memory. Typically, it may be that the value of an event of text content or of an attribute is not correctly predicted, in which case these pieces of information are coded, for example, using the EXI conventional coding, in a buffer memory, or "buffer". The pieces of information in buffer memory are here uniquely coded information, which therefore does not lead to a real cost increase in terms of memory space occupied. Instead of writing these pieces of information in the codestream, they are written in a buffer of which the content is later copied into the codestream.

According to particular features of the methods of both the first and second aspects of the present invention, during the coding step, it is determined whether the size of the buffer memory is sufficient to store the new coded data and, if not, the data stored in the buffer memory and the number of successive correct predictions are coded. The size of the buffer memory may depend on the underlying method of storage. Thus, if sending data by a protocol such as TCP/IP is involved, the size of the buffer may be determined as a function of the size of the IP packets (IP being an acronym for Internet Protocol). It may be noted that this buffer memory size may be modified at any time by the coder.

The management of the buffer memory is thus optimized.

According to particular features of the methods of both the first and second aspects of the present invention, during the coding step, use is made of a maximum number of correct predictions and when the number of successive correct predictions reaches said maximum number, said maximum number is coded.

By virtue of these provisions, the number of pieces of binary data, or bits, necessary for coding the number of successive correct predictions is limited to the number of bits necessary for coding that maximum number.

According to particular features of the methods of both the first and second aspects of the present invention, the method of the present invention, as succinctly set forth above, comprises a step of updating said maximum number as a function of the number of times that this maximum number is reached.

By virtue of these provisions, the number of bits for coding the number of successive correct predictions is dynamic and thus adapted to the document.

According to particular features of the methods of both the first and second aspects of the present invention, during the step of determining whether a succession of correct predictions exists for successive items of at least one set of items of the document, a prediction of the indexing of the values of the items is made, and a structure prediction for the items is also made.

According to particular features of the methods of both the first and second aspects of the present invention, said structured document is in XML language.

According to particular features of the methods of both the first and second aspects of the present invention, during the coding step, data are coded in Efficient XML format, each prediction being made on the basis of an EXI grammar (EXI being an acronym for "Efficient XML Interchange").

According to particular features of the methods of both the first and second aspects of the present invention, during the coding step, data are coded in the Fast Infoset format, each prediction being made on the basis of Fast Infoset tables.

According to a third aspect, the present invention concerns a method of decoding a structured document, that comprises:
   a step of decoding a number of correct successive predictions,
   a step of predicting structural information for each correctly predicted item of the document, by using said number of successive correct predictions and
   a step of decoding structural information of a non-predicted event of the document.

According to particular features, during the step of decoding the correctly predicted value of an item of the document, it is determined whether a plurality of applicable predictions exists, and, if yes, it is determined whether a prediction identifier has been coded and, if yes, said item is decoded on the basis of the prediction identified by said identifier.

According to particular features, during the step of determining whether at least one applicable prediction exists, use is made, for a production corresponding to said item, of a number of correct predictions and a number of incorrect predictions, and if the number of incorrect predictions for said production is greater than a predetermined value, which may be a function of the number of correct predictions for said production, said prediction is modified.

According to particular features, during the step of determining whether at least one applicable prediction exists, use is made, for a production corresponding to said item, of a number of correct predictions and a number of incorrect predictions, and if the number of incorrect predictions for said production is greater than a predetermined value, which may be a function of the number of correct predictions for said production, no applicable prediction exists for said item.

According to particular features, during the step of decoding the number of correct successive predictions, use is made of a maximum number of correct predictions and the method comprises a step of updating said maximum number as a function of the number of times that maximum number is reached.

According to particular features, the decoding method of the present invention, as succinctly set forth above, comprises a step of decoding the value of each correctly predicted item of the document, during which a prediction of the indexing of the values of the items is made and a structure prediction for the items is also made.

According to a fourth aspect, the present invention concerns a device for coding a structured document, that comprises:
   a means for determining whether a succession of correct predictions exists for items of a set of items of the document and
   a coding means that is adapted, if the result of said determining step is positive, to code the number of successive correct predictions.

According to a fifth aspect, the present invention concerns a device for coding a structured document comprising a set of items, the device comprising:
   means for determining available predictions for the productions associated with the items of the set of items;
   means for determining, for the items for which there exist at least one available prediction, whether at least one available prediction is correct;
   means for determining a number of successive correct predictions, wherein the items associated to the productions corresponding to said successive correct predictions may not be successive; and
   means for coding the number of successive correct predictions.

According to a sixth aspect, the present invention concerns a device for decoding a structured document, that comprises:
- a means for decoding a number of correct successive predictions,
- a means for predicting structural information for each correctly predicted item of the document by using said number of successive correct predictions and
- a means for decoding structural information of a non-predicted event of the document.

According to a seventh aspect, the present invention concerns a computer program loadable into a computer system, said program containing instructions enabling the implementation of a method of the present invention as succinctly set forth above.

According to a eighth aspect, the present invention concerns an information carrier readable by a computer or a microprocessor, removable or not, storing instructions of a computer program, that enables the implementation of a method of the present invention as succinctly set forth above.

As the advantages, objects and particular features of the method of the second to fourth aspects of the present invention, the devices of the fifth and sixth aspects, of the program of the seventh aspect and of the information carrier of the eighth aspect are similar to those of the method of the first aspect of the present invention as succinctly set forth above, they are not repeated here.

Figure 2:
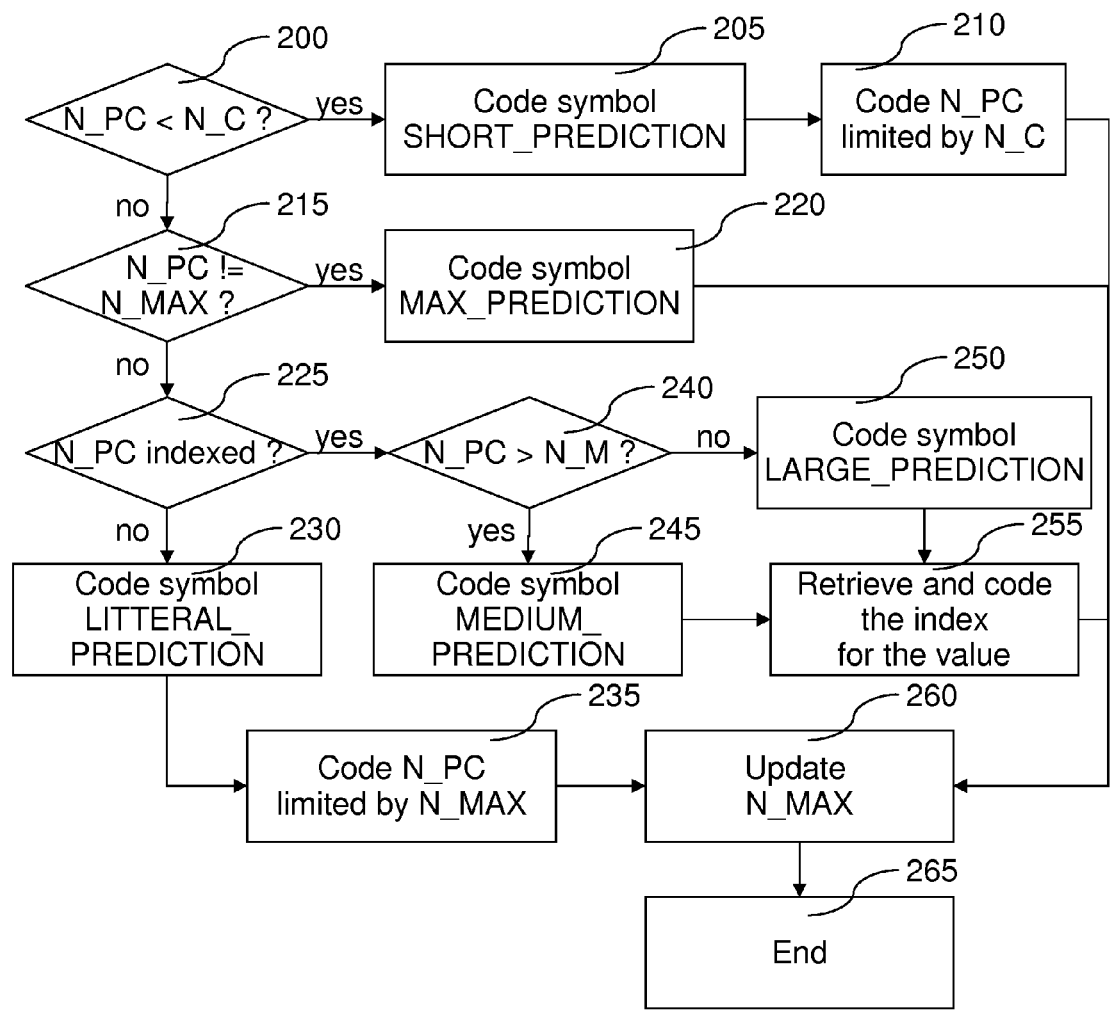
Figure 3:
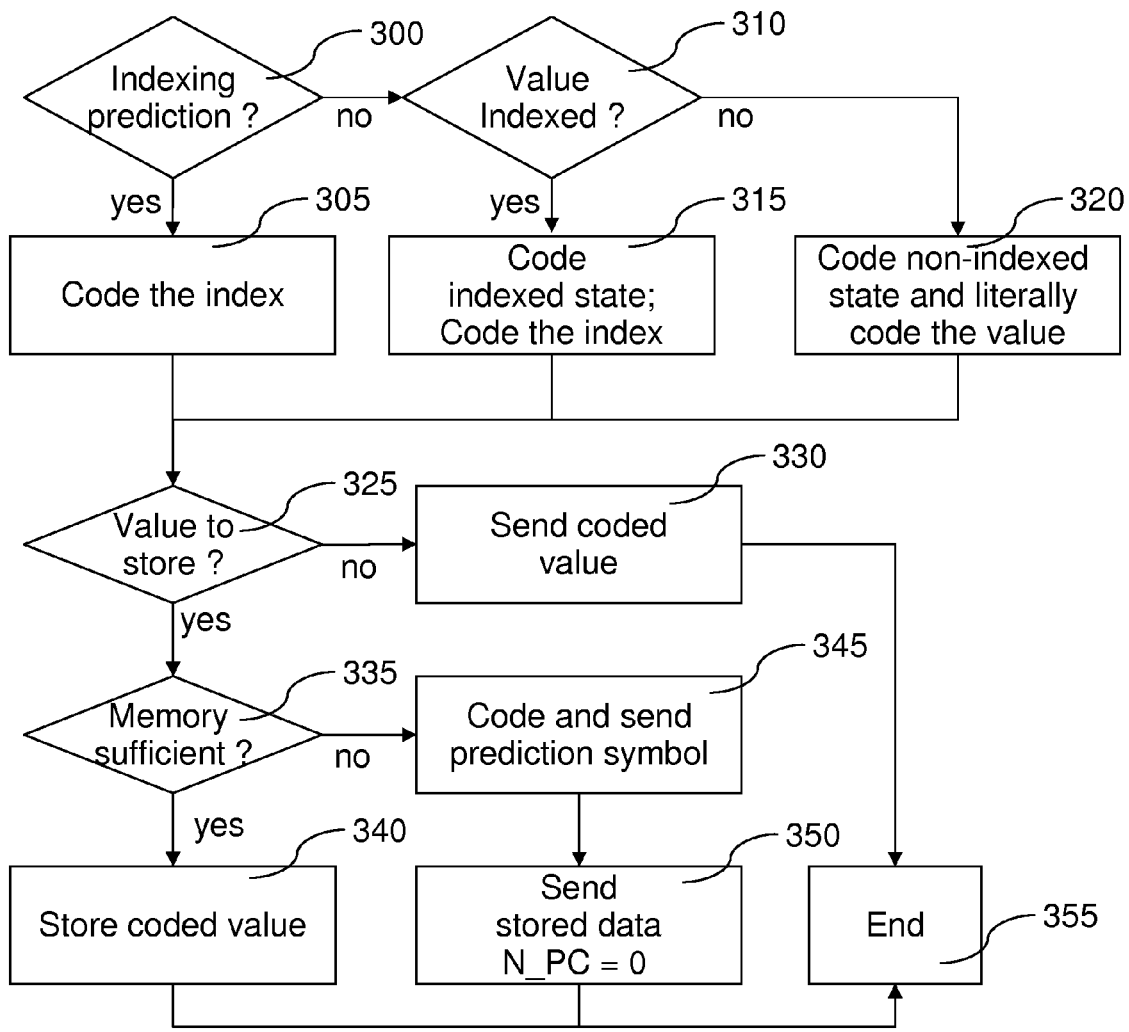
Figure 4:
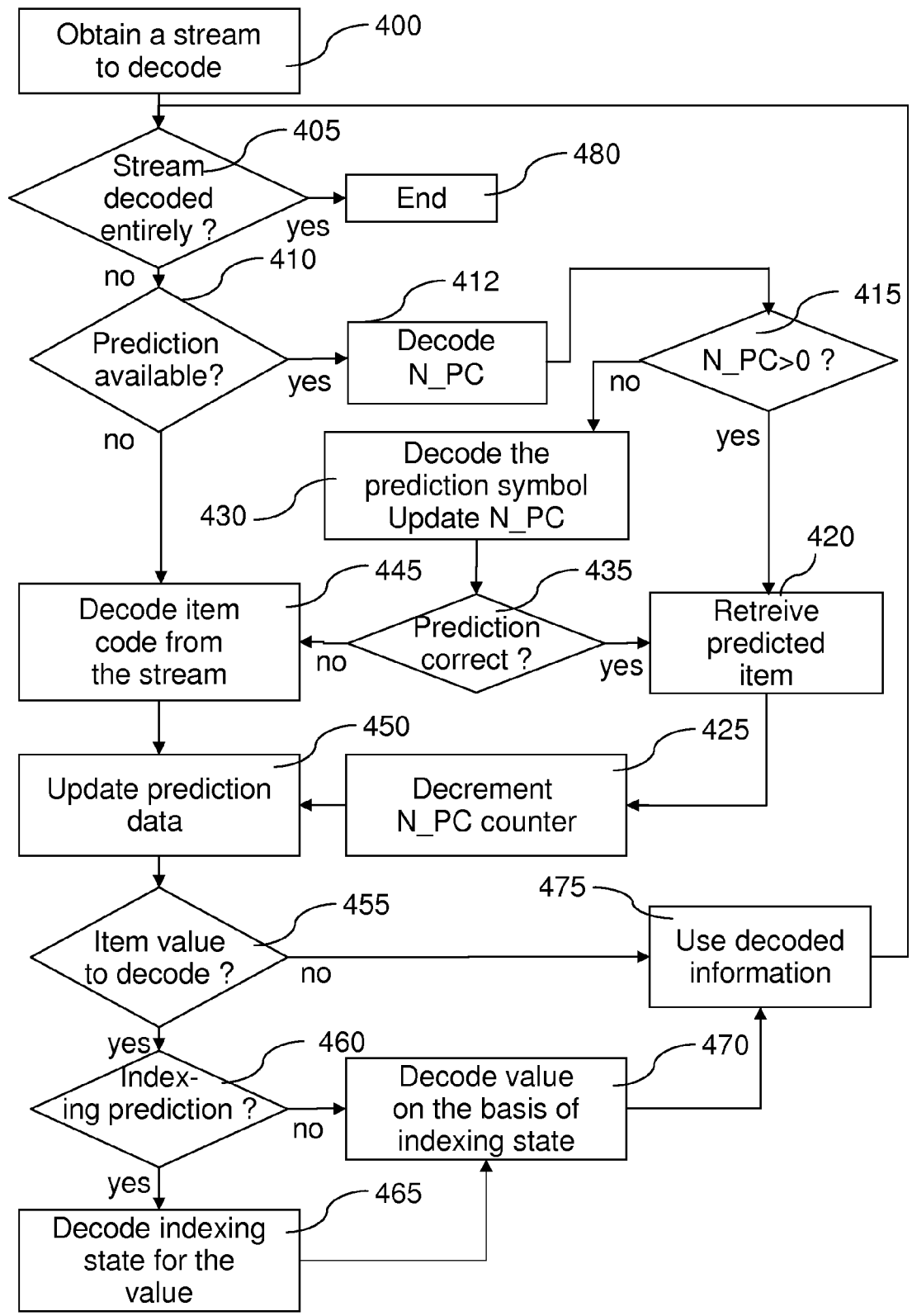
Figure 5:
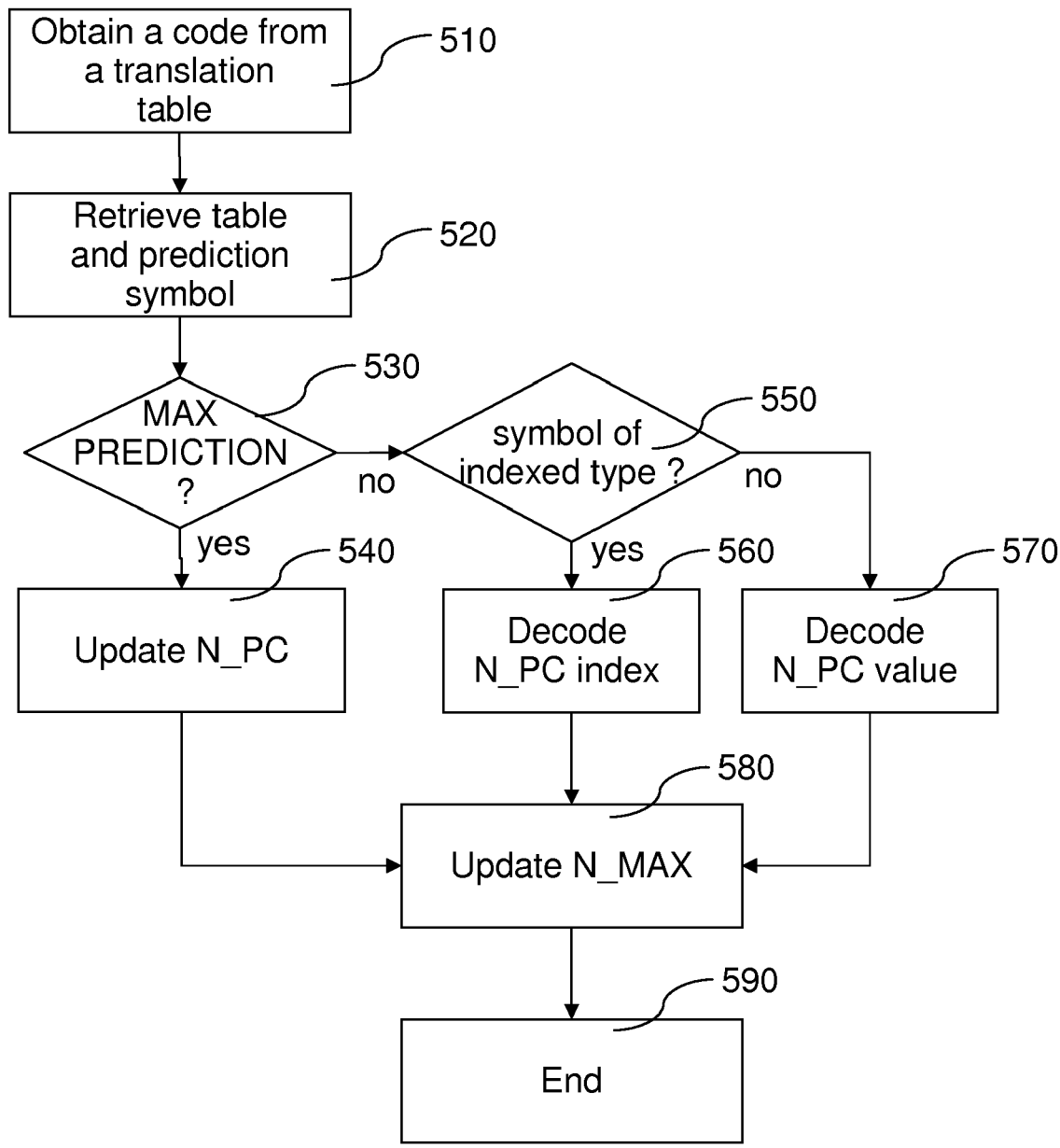
Figure 6:
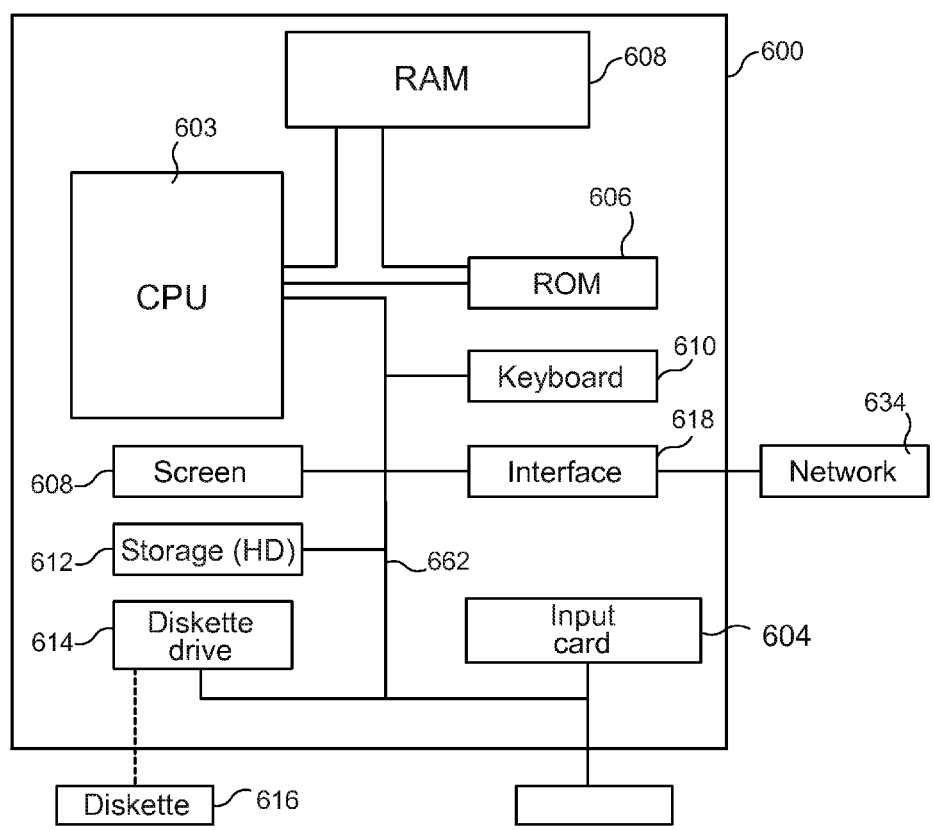
Figure 7:
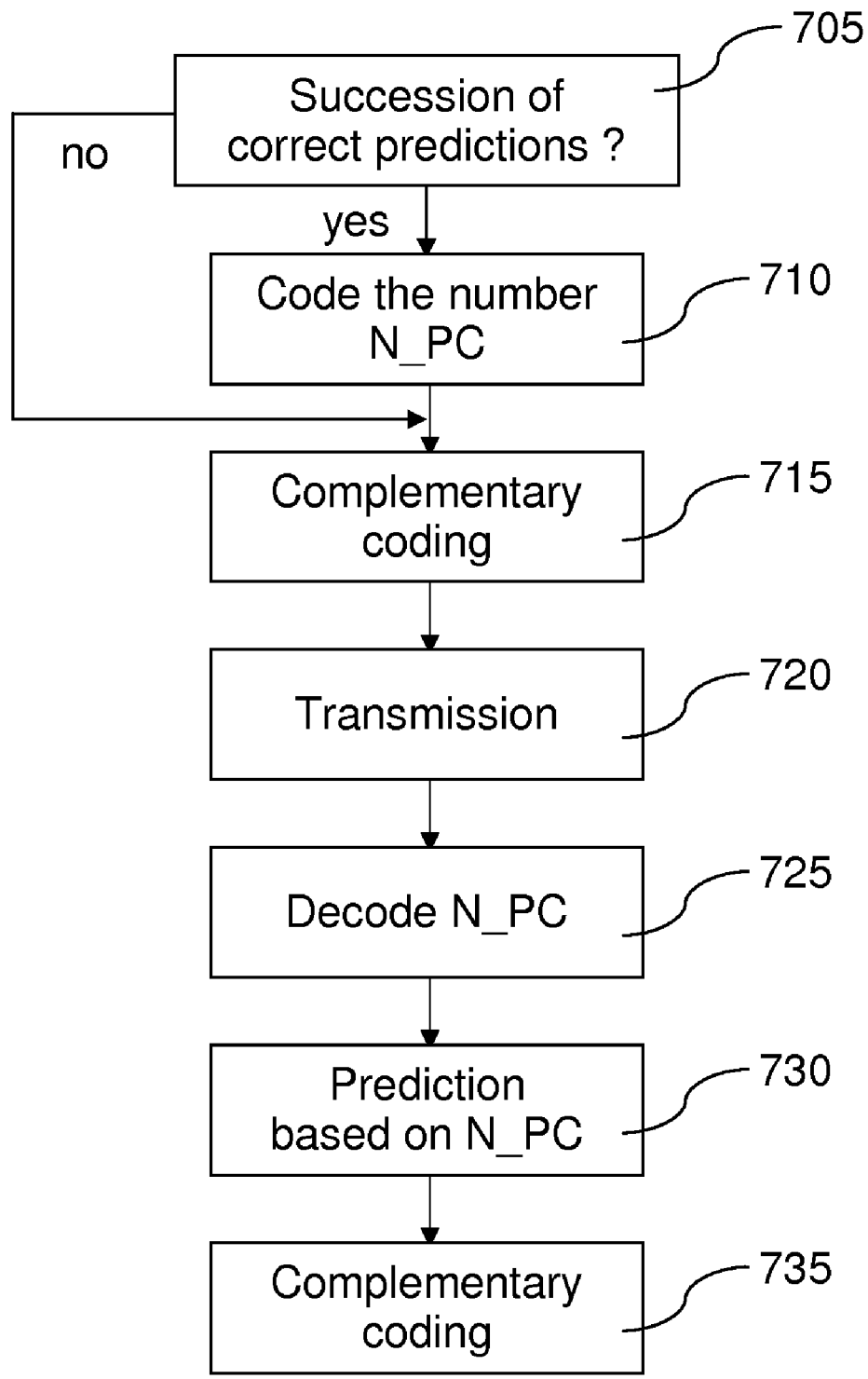
Figure 8:
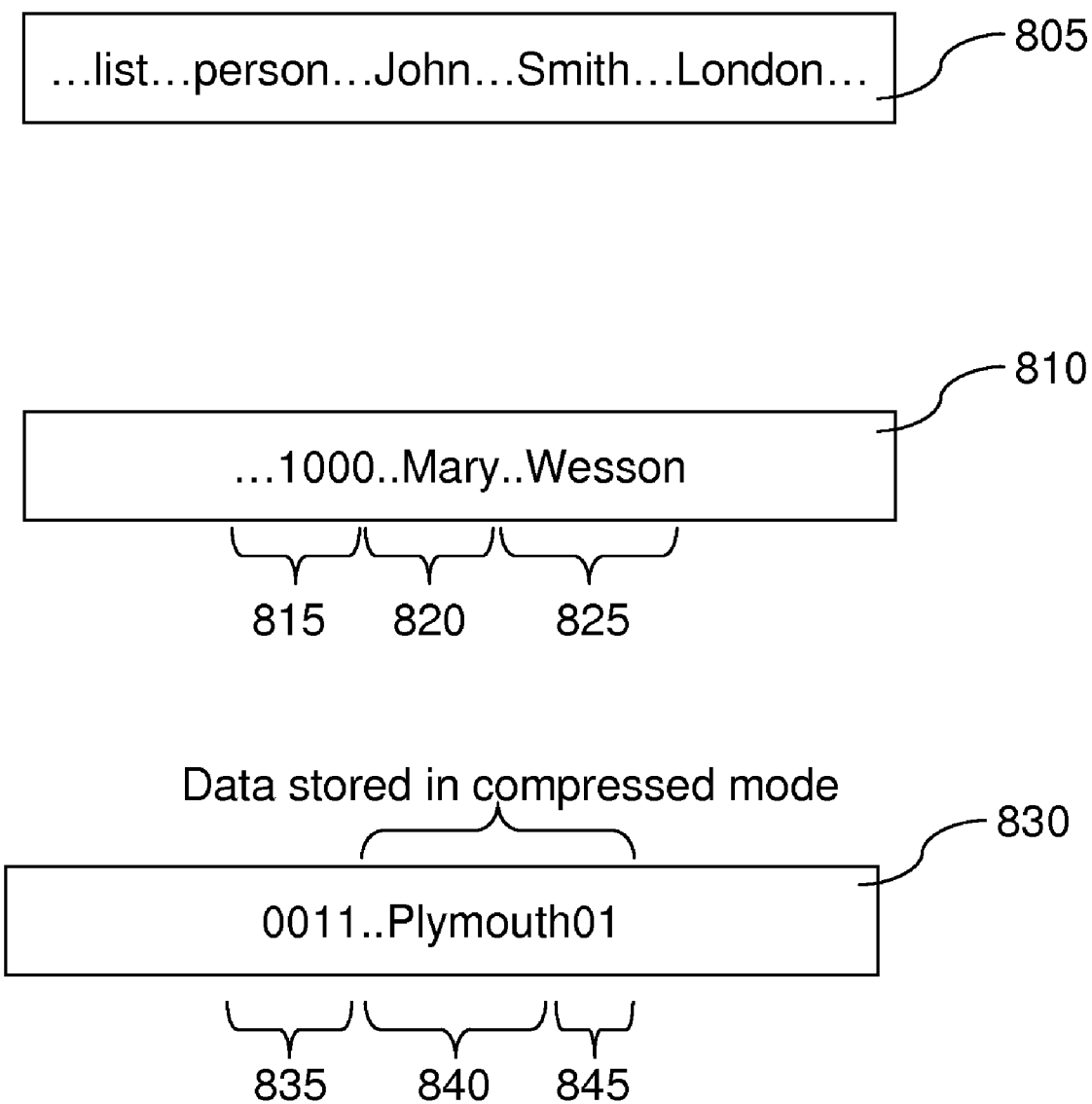

Other particular advantages, objects and features of the present invention will emerge from the following description, given, with an explanatory purpose that is in no way limiting, with reference to the accompanying drawings, in which:

FIGS. 1 to 3 are logigram representations of the steps implemented in a particular embodiment of the coding method of the present invention, FIGS. 4 and 5 are logigram representations of the steps implemented in a particular embodiment of the decoding method of the present invention, FIG. 6 is a diagram of a particular embodiment of the device of the present invention, FIG. 7 is a logigram representation of the steps implemented in simplified embodiments of the coding and decoding methods of the present invention and FIG. 8 is a diagram of coded data when implementing a particular embodiment of the coding method of the present invention.

In FIG. 7, it can be seen that a particular embodiment of the method of coding a structured document comprises, at least:
- a step 705 of determining whether a succession of correct predictions exists for items of a set of items of the document and
- if the result of said determining step is positive, a step 710 of coding the number of successive correct predictions.

Then, during a step 715, coding of any values of the correctly predicted items and coding of structural information any values of non-predicted items is carried out.

After a step 720 of transmitting the coded data, in a particular embodiment of the decoding method of the present invention, at least the following are carried out:
- a step 725 of decoding a number of correct successive predictions,
- a step 730 of predicting structural information for each correctly predicted item of the document by using said number of successive correct predictions and
- a step 735 of decoding structural information of each non-predicted item of the document.

In an explanatory aim, a description is first of all given below of an example of coding the following XML data:

```
<list>
    <person>
        <firstName>John</firstName>
        <lastName>Smith</lastName>
        <city>London</city>
    </person>
    <person>
        <firstName>Mary</firstName>
        <lastName>Wesson</lastName>
        <city>Plymouth</city>
    </person>
</list>
```

After having processed the first "person" element, the state of the grammars for the different elements encountered is the following:

| list grammar | |
|---|---|
| SE person | 0 |
| EE | 1 |
| SE * | 2.0 |
| CH | 2.1 |
| person grammar | |
| SE city | 0 |
| SE firstName | 1 |
| SE lastName | 2 |
| EE | 3 |
| SE * | 4.0 |
| CH | 4.1 |
| firstName grammar | |
| CH | 0 |
| EE | 1 |
| SE * | 2.0 |
| CH | 2.1 |
| lastName grammar | |
| CH | 0 |
| EE | 1 |
| SE * | 2.0 |
| CH | 2.1 |
| city grammar | |
| CH | 0 |
| EE | 1 |
| SE * | 2.0 |
| CH | 2.1 |

On processing the first "person" element, each production of an item, named "ITEM_A", has been associated with the following "ITEM_A" item. This means that there are the following associations:

| Current production | Following production |
|---|---|
| list grammar: SE person | person grammar: SE firstName |
| person grammar: SE firstName | firstName grammar: CH |
| firstName grammar: CH | firstName grammar: EE |
| firstName grammar: EE | person grammar: SE lastName |
| person grammar: SE lastName | lastName grammar: CH |
| lastName grammar: CH | lastName grammar: EE |
| lastName grammar: EE | person grammar: SE city |

| Current production | Following production |
| --- | --- |
| person grammar: SE city | city grammar: CH |
| city grammar: CH | city grammar: EE |
| city grammar: EE | person grammar: EE |
| person grammar: EE | * (no available prediction) |

When the second "person" element is processed, it is determined whether the content of that element is in accordance with the predictions made on the following productions. To start with, it is thus determined whether, after "list: SE person", the production "person:SE firstName" is used. This is the case here. The counter of successive correct predictions is thus increased, which then has the value "1".

According to the associations made, the production "firstName:CH" must therefore be used. Here too, this is indeed the case, the following event being an event with text content of which the value is "Mary". The counter for successive correct predictions goes to "2", and the value "Mary" is coded in the same way as would be done with EXI coding, but instead of directly writing it directly in the codestream, it is written in a buffer, the content of this buffer being subsequently copied (at the end of the prediction sequence, that is to say if the maximum of right predictions is reached or if a wrong prediction is encountered) into the codestream. Compared with conventional EXI coding, the context is exactly the same, and the coding of the value "Mary" in the buffer is identical to that for this same value in the codestream in the case of EXI coding. It should be noted that the event, in itself, does not need to be stored in the buffer, only a piece of coded data is so stored. There is in particular no need to keep hierarchical information, for example the information that this event is the child of the event "person start element."

As the structures of the first and of the second "person" element are identical, the predictions are still correct, and the counter code thus be incremented up to the end of the element. However, in order to code the number of successive correct predictions over a sufficient number of bits, a maximum number of successive correct predictions to count is set preliminarily, for example eight. This means that it is known, at the start, that the number of successive correct predictions counted will not exceed 8 and may therefore be coded in three (since $8=2^3$) binary values, or bits. If few successive predictions are correct, only a few bits are therefore lost each time (if there are three successive correct predictions, "3" is coded over three bits, whereas, if the maximum number of successive correct predictions is 256, "3" is coded in eight bits).

Here, the successive correct predictions counter reaches the value "8" with the prediction of the production "person: SE city". The fact that the maximum number of predictions has been reached is then coded, and then this number is increased, for example with the value "16". If, later, this maximum is reached, it may be increased again. A maximum threshold may be set, for example "256", so as always to code the predictions over one byte at maximum. If on the contrary the maximum number is never reached, it is possible to reduce it.

When the prediction of "person:SE city" is reached, the fact that the maximum number of predictions has been reached is thus coded, and then the content of the coded data buffer is copied to the codestream (here, the buffer contains the values "Mary" and "Wesson"). The same steps are then recommenced, the successive correct predictions counter being reset to "0". When the end of the document is reached, an item "list:EE" is proceeded to from an item "person:EE".

As this transition has not been correctly predicted (this is the first time it occurs), the following are coded:
the current number of successive correct predictions (the current value of the counter),
then the content of the buffer, and
lastly the event which could not be predicted, using conventional EXI coding, for example code of the production used and any complementary information (here, it is an end element, and there is therefore no complementary information). In FIG. 8, an illustration is presented of the codestream as described above, but omitting the accessory data that are well known to the person skilled in the art. In this FIG. 8:
the first data block 805, represented at the top in FIG. 8, represents the meaning of a bitstream, which is identical to the EXI coding due to the lack of available prediction.
the second data block 810 first of all comprises a number 815 of successive correct predictions N_PC equal to 8, coded in binary by "1000", then an item value "Mary" 820 corresponding to the field CH firstName and an item value "Wesson" 825 corresponding to the field CH lastName, the values 820 and 825 being stored in compressed mode.
the third data block 830 first of all comprises a number 835 of successive predictions N_PC equal to 3, coded in binary by "0011", then an item value "Plymouth" 840 corresponding to the field CH city and symbols "01" corresponding to the fields EE(list) and ED, the values 840 and 845 being stored in compressed mode.

As regards the construction of the predictions, the prediction module is divided into two parts:
a statistical data collection module enabling the prediction and
an actual prediction module for an XML item.

The statistical data may be collected in a first phase or via the coding of XML data similar to the data to code. These statistical data may also be initialized on the basis of an XML schema. In the context of a preferred embodiment, statistical data are merely retrieved progressively with the advancement of the coding of the XML data. The main advantage is a very low cost in terms of program complexity and processing time while maintaining very worthwhile performance in terms of compression.

The exact statistical data to collect depend on the prediction model. Different prediction systems are possible, of greater or lesser complexity. Some systems may be derived from the branch prediction methods studied for processors (http://en.wikipedia.org/wiki/Branch_prediction). These different methods reply on a record which may contain:
the N previously coded items,
the P parent XML elements of the item to code and
the M past occurrences of a same item.

The preferred embodiment relies on a system which implements the means used for performing binary XML compression (Fast Infoset tables, EXI grammars). To improve the efficiency of this system, management of false prediction may be added to the prediction module. When the predictions made on the basis of an item are often false, it may then be decided to:
not produce any prediction and/or
produce a prediction comprising several productions with different probabilities, In both these cases, the solution is to send, into the binary stream, a code enabling the production of the actual item to be retrieved. When no prediction is available, the code is exactly that generated by the standard coding (code of the production by EXI or code of the Fast Infoset event). When several possibilities for productions are predicted, the code may be obtained on the basis of a Huffman coding based on the different probabilities for the predictions. This particular embodiment will not be described below. However, the person skilled in the art will have no difficulty in adapting the coding (FIG. 1) and decoding (FIG. 4) methods to this particular embodiment. In a simple embodiment, the same probability is allocated to each production possibility, so as neither to have to calculate the probabilities for the productions nor to dynamically calculate the codes corresponding to each production.

In a simple embodiment, the preceding item (N=1) and a single occurrence of the item (M=1), generally the last occurrence are the sole basis. The parents of an item to code are not directly taken into account (P=0).

The integration of the prediction module into EXI and Fast Infoset is presented below. As regards the EXI prediction module, the integration of a prediction means in EXI may be achieved simply, as follows:
- the item of type B is coded after having coded the preceding item of type A,
- to code the item of type B, its corresponding production B is retrieved. This production B makes it possible to code the item of type B unambiguously,
- the production A of the item A may then be linked to the production B. On coding a new item A, the production A is retrieved which makes it possible to predict the use of the production B, that is to say the coding of a new item of type B,
- this link may be made on the basis of a schema or data that were previously coded. This link may be defined once and for all (the first time or in advance). This method makes it possible in particular to reduce the cost of coding by eliminating any management of the predictions on coding.

In a preferred embodiment, this link is updated at each use of the production of the item A. It is noted that this method does not require knowledge in advance of the document to code, or schema or equivalent document(s) and easily adapts to the document to code.

As regards the lack of prediction, it is to be noted that this is mainly involved in the following two cases:
- when there is not enough record information obtained: this case is frequent at the start of the coding of a document, in particular in the presence of the first occurrence of an element,
- when a prediction is too often erroneous to be used: this case occurs when a high variability is observed after a given production. For example, some elements may have a single child element of which the name frequently varies (equivalent to the constraint "xs:choice" of the schema language XML Schema).

To take into account this second case, an "opacity" of a production is calculated on the basis of a minimum rate of correct prediction. This opacity is mainly advantageous when the prediction means is based on a relatively weak record and enables the prediction failures to be mitigated with a low-cost method. It is noted that the determination of the opacity requires, for the coder and for the decoder, the number of correct predictions and the number of incorrect predictions to be kept.

It is noted that a series of predictions may be followed by a series of absence of predictions, in case of an unknown new item or opacity. In this case, the non-predicted productions are coded in the stored data, which makes it possible to have a very simple decoding algorithm (see FIG. 4).

The prediction makes it possible to predict the sequences of items within an element not yet encountered. In the following example:

```
<root>
    <a><b></b><c></c></a>
    <d><b></b><c></c></d>
</root>
```

Depending on the embodiment, the prediction may correctly predict as follows (the correct predictions are underlined):

```
<root>
    <a><b></b><c></c></a>
    <d><b></b><c></c></d>
    <e><b></b><c></c></e>
</root>
Predictions SE(b) → EE et SE(c) → EE
<root>
    <a><b></b><c></c></a>
    <d><b></b><c></c></d>
    <e><b></b><c></c></e>
</root>
Predictions SE(b) → EE(b) → SE(c) → EE(c) → EE
```

The second variant is based on the fact that:
- there is a prediction between EE(b) and SE(c),
- the element d is encountered for the first time and
- in this case, the prediction EE(b)→SE(c) is used even if it has not been validated in the context of the element d. In this particular case, it may be noted that the prediction commences for the second element 'b' and that it stops at the end of the data ("root" node): more particularly, no prediction error appears. It may also be noted that certain items have no prediction (passage from EE(d) to SE(e) for example). In this case, the correct predictions counter is not incremented and use is made of the code of the production corresponding to the item in the stored data.

A particular case frequently arising is the case of repeating elements, as in the following examples (the correct predictions are underlined and the incorrect predictions are placed between brackets):

```
<root>
    <a><b></b></a>
    <a><b></b></a>
    <a><b></b></a>
    <a><b></b></a>
    <a><b></b></a>
(</root>)
<root>
    <a><b></b></a>
    <a><b></b></a>
(</root>)
```

These two examples highlight the following points:
- there is a prediction for repetition of the element a and c as from the third occurrence of the element and
- the end of the repetition is interpreted as a prediction error.

This method makes it possible not to manage the prediction of the repetitions differently to the other cases of predictions. It may be noted that this method works particularly well for high cardinalities and works less efficiently for small cardinalities (2, typically). The management of prediction error (opacity or multiple predictions) then enables this particular case to be circumvented.

Another embodiment for good management of repetitions consists of keeping a record of the past occurrences (M=3 for example). This record makes it possible to determine whether there is a repetition of an element, in which case the prediction module defines two or more possible predictions and the successive correct predictions counter is incremented while directly coding the index of the correct prediction in the stored data. An additional refinement of this embodiment is to keep the number of past repetitions so making it possible to predict the exact number of repetitions.

It is noted that these reinforcements are particularly advantageous when errors occur and are not advantageous when a simple prediction means is sufficient. On account of this, this more costly system of statistics collection may be put in place solely for the productions requiring it, that is to say the opaque productions. In one embodiment, the number of correct predictions and the number of incorrect predictions are collected for each production. The production is marked as opaque when the number of correct predictions is insufficient, and collection of a greater amount of statistics is started for that production, for example by keeping a record of the past occurrences (M=3). This collection leads to a potentially more efficient prediction. Thus the collection of statistics is limited to the productions for which the prediction is difficult, which limits the processing cost increase. It is noted that the rules for changing prediction must be shared by the coder and the decoder.

As regards the Fast Infoset prediction module, consideration is based on a table for indexing the elements which contains, by default, a relationship between an index and an element qualified name. Data are integrated into this relationship enabling the prediction of the elements and attributes to come. These data may easily be increased to predict the end elements and text nodes. Thus, a prediction means is obtained which easily integrates into Fast Infoset. The various algorithms presented later are more particularly dedicated to EXI but easily adapt to Fast Infoset.

A description will now be given, with reference to FIG. 1, of the steps implemented in a particular embodiment of the coding method of the present invention.

The coding commences with a step 100 of obtaining XML data to process. Each item of the XML data is processed sequentially, according to an iteration passing via a step 105 during which it is determined whether all the XML items are processed and, if that is not the case, a step 110 during which the following item is obtained. When all the XML items have been processed, the coding process ends, during a step 185.

For each item, the processing commences, during a step 115, with the determination of whether at least one prediction is available or applicable. For example, no prediction is available if there is no statistic or if the production considered is opaque. Conversely, several predictions may be applicable to the production associated with the item considered. Each available prediction is determined by one of the means described above.

It is noted that, in some embodiments, during the step 115, at least one invariable prediction is implemented for all the items of said part of the set of items of the document.

If at least one prediction is available, it is determined, during a step 120, whether that available prediction is correct. This step is generally carried out by directly comparing each prediction obtained to the item to code in the following manner:

comparing the types of event,
comparing the item names (if any),
if the item has a value, comparing the indexing, if it is available. This comparison determines whether the prediction defines an indexing state. If that is the case, it is determined whether the indexing prediction is correct or not (see below the part on the coding of the values and the storage of the data).

In the case of EXI, a second method may also be used: retrieve the production of the item to code (a function that is necessary to the coding when no prediction is available) and compare the predicted production to the real production. The first method, which is simple, enables processing time savings compared to the second method, in particular when the prediction means is sufficiently accurate.

If a prediction is correct, it is determined, during a step 122, whether a sole prediction was available. If not, during a step 124, an identifier is coded for the correct prediction from among the available predictions. If the result of step 122 is positive, or further to step 124, the number of correct predictions, N_PC, is incremented at a step 125, then, during a step 135, it is determined whether the coding/sending of the number of correct predictions to the bitstream via a prediction symbol should be carried out. This coding/sending may be caused to be made for several reasons:

the size of the data stored during one of the steps 160, 165 and 175 of preceding iterations becomes too great for the coder,
the number of correct predictions reaches a sufficiently high number to code that information in the bitstream (see, below, the part on the coding of the symbols).

Where it is desired to code the prediction symbol, that prediction symbol is coded during a step 140 (described in more detail with reference to FIG. 2), as well as the number of successive correct predictions N_PC obtained. The data stored at the preceding steps are then sent into the bitstream (see the part on the coding of symbols), during a step 145. The buffer for storing the data is then empty and N_PC is reinitialized to "0". Further to step 145, or in the case where it is not necessary to send the symbol, the data serving to determine the prediction are updated, at a step 150. This step 150 depends on the means implemented for the prediction. It may for example be a matter of updating the statistics on opacity, that is to say the number of correct predictions (step 150) and the number of incorrect predictions (step 180) for the production associated with the item considered. In the particular case of a means for prediction with a record for an item and with opacity management, only the correct predictions counter for the production associated with the item considered is incremented, at the step 150. In the particular case of a prediction means with a record for an item and without opacity, no updating is necessary at step 150.

The updating step 150 may also consist of modifying the prediction. It is, in this case, preferentially carried out only if the number of times that the prediction is correct is greater than a predetermined number, which may depend on the number of times that the prediction is correct. The pertinence of the prediction is thus increased, the number of items coded via the number of successive correct predictions is increased.

Thus, during the step of determining whether at least one applicable prediction exists, step 115, use is made, for a production corresponding to the item considered, of a number of correct predictions and of a number of incorrect predictions and if the number of incorrect predictions for said production is greater than a predetermined value, the production is considered to be opaque. It is noted that the number of incorrect predictions compared to the predetermined value may depend on the number of correct predictions for said production, through use of a ratio of incorrect predictions to the total number of predictions. As has been seen, for an item associated with an opaque production, during the step 115, it is considered that no applicable prediction exists.

In the case where, during the step 120, it is determined that no available prediction is correct, step 165 is proceeded to, during which a symbol representing the prediction is coded (which coding is described in more detail with reference to FIG. 2). It is preferable that this symbol also represent the information on the exact number of correct predictions (N_PC) encountered before the last item. This prediction symbol may also represent the fact that the item following the N_PC correctly predicted successive items has not been correctly predicted and/or the structure of the item. At the decoder, it will be necessary to read the code of the item (EXI production or Fast Infoset code) directly in the stream. Further to the coding and the sending of this symbol, the data stored during the coding operations for the preceding items is sent, during a step 170. The buffer for storing the data is then empty and N_PC is reinitialized to "0". It then remains to retrieve the real code for the item (via the production for the item to code for EXI or via the type of event and the different indexing tables for Fast Infoset). Next, during a step 175, the item is coded and the code obtained is sent directly into the bitstream. More particularly, the structural information of the item is coded during step 175.

In the case where no prediction is available at step 115, step 175 is proceeded to directly. The code of the item to code is retrieved. The sending of the code corresponding to the item is carried out when the number of successive correct predictions N_PC is equal to zero. Otherwise, the code is stored in the data buffer to be sent later (at one of the steps 145 or 170).

In the particular case of the prediction means described previously (record with opacity detection), the prediction is updated on the basis of the coding information from step 175 (production retrieved at step 175 by EXI or indexing table entry for Fast Infoset) as well as the opacity statistics for the production of the preceding item.

Next, during a step 180, the prediction data are updated in similar manner to step 150. In the particular case of a means for prediction with a record of an item and with opacity management, only the incorrect predictions counter is incremented for the production associated with the item considered, at the step 180.

Once the prediction data have been updated during one of the steps 150 or 180, it is determined whether the XML item possesses a value (item of attribute, text node, comment, IP etc. type) during a step 155. If there is no value, step 105 is returned to. Otherwise, the value is coded during a step 160, as detailed with reference to FIG. 3, before returning to step 105.

The coding of the prediction symbols is described with reference to FIG. 2. This coding is carried out either during the step 140, or during the step 165. The symbol mainly contains the information on the number of correct predictions. It may also include information on the validity of the prediction which will follow the N_PC correct successive predictions. Typically, some symbols may declare that the prediction following the N_PC correct successive predictions is incorrect.

As explained previously, a maximum number "N_MAX" of successive correct predictions is set, this maximum number being able to adapt to the regularity of the XML data as explained elsewhere. This maximum number of successive correct predictions enables N_PC to be coded relatively to that maximum number, which enables quite a compact representation of that value.

In one embodiment, adaptive Huffman coding may be used. The Huffman table includes, in this case, N_MAX symbols. When N_MAX is increased or reduced (to take into account the regularity of the XML data), the Huffman table gets bigger or smaller. Each symbol of the Huffman table corresponds to a possible value of N_PC. For each value N_PC coded, the probability of the value N_PC is updated and the codes associated with each value are recalculated. As some symbols have, at the start, an null probability, it is possible to:

add a symbol NEW_SYMBOL to the Huffman table which indicates that a new N_PC value is coded. After this symbol, the value is coded relatively to N_MAX or define a maximum code size via the "Length-limited Huffman coding" method.

This approach requires the continual updating of the Huffman table whereas it may be noted that the distribution of the values of N_PC is not uniform. Thus the N_PC values greater than 32 are of low frequency and repeat little. On account of this, to reduce the size of the Huffman table, it is possible to keep the symbols only for values lower than a relatively low threshold, 24 or 32 for example.

FIG. 2 presents a relatively high performance method and which is less costly than the method using a principle of adaptive Huffman coding. In this method, five symbols are first of all defined:

"SHORT_PREDICTION": N_PC between 0 and 3,

"MEDIUM_PREDICTION": indexed N_PC between 4 and 11,

"LARGE_PREDICTION": indexed N_PC between 12 and 27,

"MAX_PREDICTION": N_PC equal to N_MAX and

"LITTERAL_PREDICTION": N_PC between 4 and N_MAX,

Three types of documents are also defined:

"very repetitive" documents: the prediction module has very good performance and the "MAX_PREDICTION" symbol is very often used.

"quite repetitive" documents: the prediction module is has quite good performance to obtain quite large predictions and the symbols "MEDIUM_PREDICTION", "SHORT_PREDICTION" are often used and "very variable" documents: the prediction module has poor performance and the "SHORT_PREDICTION" symbol is most often used.

For each of these documents, a suitable Huffman table is defined.

Huffman table for very repetitive documents:

| | |
|---|---|
| SHORT_PREDICTION: | code 10 |
| MEDIUM_PREDICTION: | code 110 |
| LARGE_PREDICTION: | code 1110 |
| MAX_PREDICTION: | code 0 |
| LITERAL_PREDICTION: | code 1111 |

Huffman table for quite repetitive documents:

| | |
|---|---|
| SHORT_PREDICTION: | code 10 |
| MEDIUM_PREDICTION: | code 0 |
| LARGE_PREDICTION: | code 110 |
| MAX_PREDICTION: | code 1110 |
| LITERAL_PREDICTION: | code 1111 |

Huffman table for documents of low repetitiveness:

| | |
|---|---|
| SHORT_PREDICTION: | code 0 |
| MEDIUM_PREDICTION: | code 10 |
| LARGE_PREDICTION: | code 110 |
| MAX_PREDICTION: | code 1110 |
| LITERAL_PREDICTION: | code 1111 |

The choice of the Huffman table is made on the basis of a statistical criterion of occurrence of the different symbols:

"TEST_OCC1": If OCCURRENCE(MAX_PREDICTION)>OCCURRENCE(SHORT_PREDICTION), document of very repetitive type "TEST_OCC2": If OCCURRENCE(MEDIUM_PREDICTION)>OCCURRENCE(SHORT_PREDICTION), document of quite repetitive type otherwise, document of low repetitiveness type.

FIG. 2 presents a possible implementation of the algorithm. Commencement is made by determining, during a step 200, whether the number of successive correct predictions N_PC is less than a predetermined value "N_C", typically equal to four. If yes, during a step 205, SHORT_PREDICTION symbol coding is carried out by determining the type of document via the test TEST_OCC2. Next, during a step 210, the value N_PC is coded relatively to the value N_C. For example, when the value of N_C is equal to four, the value N_PC is coded over two bits. The value N_MAX may then possibly be updated, during a step 260 described later.

If the number of correct successive predictions N_PC is greater than or equal to the value N_C, it is determined whether the value N_PC is equal to the value N_MAX, during a step 215, after having decremented N_PC by the value N_C. If yes, the symbol MAX_PREDICTION is coded during a step 220, by determining the type of documents via the test TEST_OCC1. A step 260 of updating the value N_MAX is then proceeded to.

If the value N_PC is different to the value N_MAX, it is determined, during a step 225, whether the value N_PC is indexed. The value N_PC is indexed if it has been coded in the bitstream and if that value is sufficiently small to have a good probability of repeating (value less than or equal to 27 in the embodiment presented). It is noted that, for this purpose, an indexing table is kept representing each value already coded in relation to an index.

If this value has not been indexed, it is indexed and the symbol LITTERAL_PREDICTION is coded of which the code is static, that is to say the same for the three tables envisaged, during a step 230. Next, the literal value is coded relatively to the value N_MAX during a step 235. A step 260 of updating the value N_MAX is then proceeded to.

If the value N_PC is indexed, it is determined whether the value N_PC is greater than a predetermined value "N_M" (typically 12) during a step 240. If not, the symbol LARGE_PREDICTION is coded by determining the type of document via the test TEST_OCC1, during a step 250. If the value of N_PC is less than or equal to the value N_M, the symbol MEDIUM_PREDICTION is coded by determining the type of document through the tests TEST_OCC1 and TEST_OCC2 during a step 245. Once the symbol has been coded, the index of the value N_PC is retrieved and that index is coded during a step 255. The step 260 of updating the value N_MAX is then proceeded to.

The updating of the value N_MAX, during the step 260, may consist of increasing or reducing N_MAX. It is possible to increase N_MAX when the value N_PC reaches that value N_MAX. Typically, the value of N_MAX is multiplied by two when the symbol MAX_PREDICTION has been coded, during the step 220. On the contrary, the value N_MAX is reduced when the symbol MAX_PREDICTION is rarely coded. As this value N_MAX only has an impact on the literal coding of N_PC, the value of N_MAX can be reduced after coding a symbol LITTERAL_PREDICTION. In reality, this reduction may be made after the symbol LITTERAL_PREDICTION has been coded several times without intervening coding of a MAX_PREDICTION symbol.

As regards the coding of the values and the storage of the data, a description is given below of a process for storing the data which may be implemented in several ways. A list of values may first of all be kept (strings, production). These values may also be kept in the form of a coded bitstream stored in memory. In this case, the stored values are coded using the standard format (EXI or Fast Infoset), and the result of this coding then being stored in a buffer.

This method is preferable since more efficient in terms of processing time and memory use. In terms of processing time, only the cost increase of managing a buffer is added, which may be compensated by the fact that the writing of the data is made in one block, which may be preferable, for example in the case of writing to a file. In terms of memory management, the coding described makes it possible, when the buffer is too large, to send the coding corresponding to the current N_PC value then the stored data. This enables the size of the buffer to be limited in exchange for a slight loss in compression performance.

This last storage method nevertheless has a potential disadvantage: the bitstream is not always byte oriented but may alternatively be bit oriented. In this last case, the bitstream sent and the stored bitstream are not necessarily aligned in the same manner since a choice of alignment must be made at the beginning of storing the data which will not be the same as that of the stream once the prediction symbol has been coded. Several methods are then possible:

- fix the alignment of the buffer and, at the time of sending the data, add the necessary number of bits to the bitstream to achieve the alignment of the stored data (it being noted that it may be possible to predict the alignment or to code the prediction symbol on the basis of that alignment),
- offset all the stored data by the number of bits necessary at the time of sending and
- some data sometimes require to be aligned (strings in EXI for example when the byte-aligned mode is used) in which case the stored data may be kept in non-coded form until data has been obtained requiring a particular alignment.

This method of storing the data is in particular advantageous since is enables large savings in processing time and memory:

- a correctly predicted SE or EE item is not stored in memory,
- an SE or EE item not correctly predicted is kept in compressed form, which is compact and has no impact in terms of processing time or in the form of an EXI production or a reference to a Fast Infoset table.

of a correctly predicted attribute or text node item, only its value is kept, in compressed form or not, of an attribute or text node item not correctly predicted, only its production/reference and its value is kept (in compressed form or not).

The method of storage values is now described with reference to FIG. 3. First of all, it is determined, during a step 300, whether it has been predicted that the value is indexed. If a prediction exists, the index of the value is coded, during a step 305. Two variant embodiments of this step are possible:

on the prediction determination during the step 120, the indexing state has been determined, in which case step 305 is always performed on values which have an index or no determination is made at step 120. In this case, step 305 determines whether the value is indexed. If this is the case, the index is coded during this step 305. If this is not the case, the maximum index of the table is coded then the literal value is coded.

The first variant includes possible prediction errors due to wrong prediction of the indexing. The second variant manages the prediction errors due to wrong prediction of the indexing through slightly longer coding of the string.

A third possible variant is to separate the predictions for structure and indexing. On account of this, for the coding of an attribute or a text node, a prediction may possibly be made of the structure of the item and another prediction may possibly be carried out of the indexing state. The algorithm of FIGS. 1 and 3 easily adapts to this variant.

If, during the step 300, it is determined that no prediction is available, it is determined whether the value is indexed during a step 310 (this information may come from the result of step 120). If the value is indexed, the indexed state is coded then the value of the index during a step 315. Otherwise, the non-indexed state is coded then the literal value, during a step 320.

When the value is coded further to one of the steps 305, 315 or 320, it is determined whether the value is to be stored during a step 325. Storage applies when at least one correct prediction has been made, that is to say when N_PC is strictly greater than zero. If storage is not necessary, the coded data are sent directly during a step 330 and the algorithm of FIG. 3 ends during a step 355.

If storage is necessary, it is determined whether the size of the buffer is sufficient during a step 335. If the size of the buffer is sufficient, the coded data are stored in the buffer during a step 340 and the algorithm of FIG. 3 ends during the step 355. If this is not the case, the prediction symbol is coded, during a step 345, in a similar manner to step 140 then the stored data and the coded value are sent, during a step 350, in a similar manner to step 145 and the algorithm of FIG. 3 ends at step 355.

The decoder comprises three main parts, a module for decoding the binary information, a prediction module and a module for formatting the decoded information.

The principle of the prediction module for the decoding is similar to the prediction module for the coding. The main difference is that the coder constructs the prediction on the basis of:

XML information to code and
prediction tests (in particular for the opacity).
The decoder constructs the prediction on the basis of:
decoded binary XML information (EXI production or Fast Infoset reference),
prediction tests: when a prediction is not available or is declared as not in conformity, the decoder may have to determine this non-conformity, for example in the case where the decoder has to calculate the opacity of an EXI production.

The decoding module operates in symmetrical manner to the coder: the decoder decodes a number of correct predictions which is decremented when a prediction is available. The central function of the decoder is thus to perform the construction of the predictions in symmetrical manner to the coder and to correctly decode the symbols indicating the number of correct predictions. FIG. 4 illustrates a possible embodiment for the decoding method of the present invention.

The method commences by the obtainment of the bitstream, during a step 400. Next, it is determined whether the stream has been entirely decoded, during a step 405. If information remains to be decoded, it is determined, during a step 410, whether a prediction is available. If no prediction is available, the code of the item is decoded in the bitstream during a step 445 (code of an EXI production or index in a Fast Infoset table). The prediction data are then updated during a step 450.

If it is determined, during the step 410, that a prediction is available, a number of successive correct predictions is decoded, during a step 412 and it is determined whether the number N_PC pf correct predictions is strictly greater than zero, during a step 415. If that is the case, the item is retrieved on the basis of the prediction, during a step 420, and the value N_PC is decremented, during a step 425. The prediction data are then updated during the step 450 (opacity, record, etc.). If the prediction comprises several possibilities, the retrieval of the item on the basis of the prediction, during the step 420, requires the decoding of the code corresponding to the prediction used on coding.

Where the value N_PC is determined as null during the step 415, a prediction symbol is decoded during a step 430 enabling a value for N_PC to be updated (see FIG. 5). Then, during a step 435, it is determined whether the current prediction is correct. If yes, the prediction is applied to retrieve the item, during the step 420 and the value of N_PC is decremented, during the step 425. If the prediction is incorrect, the code of the item is directly decoded from the bitstream, during the step 445.

Further to step 450, the type of the item is known. During a step 455, it is determined whether the item has an associated value to decode (typically an attribute or text node item). If the item has no value to decode, all the information concerning the item is available, and an application can then use that information, for example via an XML API (SAX, PULL, etc.), during a step 475.

If the decoder has to decode a value for the item, it is determined whether there is an indexing prediction, during a step 460. If not, the indexing state is decoded from the bitstream, during a step 465. Once the indexing state is known or if there is no indexing prediction, the value of the item is decoded during a step 470. The step 475 of using the information of the item is then proceeded to. The method ends, during a step 480, when step 405 determines that the bitstream has been fully decoded.

The decoding of the prediction symbol is illustrated in FIG. 5. During a step 510, a binary symbol is obtained from the bitstream. This binary symbol corresponds to a code in a Huffman table. Next the Huffman table used in the current state is retrieved, during a step 520. For this, the occurrence tests TEST_OCC1 and TEST_OCC2 are used as presented with regard to the coding. The binary symbol is next translated into a prediction symbol, during the step 520, and the counters used by the occurrence tests TEST_OCC and TEST_OCC2 are updated.

Next the type of prediction symbol is determined, for example by commencing with MAX_PREDICTION during a step 530. If it is the MAX_PREDICTION symbol, the value of N_PC is updated to N_MAX, during a step 540.

If it is not the MAX_PREDICTION symbol, it is determined whether it is a symbol of indexed type (MEDIUM_PREDICTION or LARGE_PREDICTION) or of literal type (LITERAL_PREDICTION or SHORT_PREDICTION), during a step 550. If it is a symbol of indexed type, an index is decoded relatively to the table of the associated symbol, during a step 560, which makes it possible to retrieve the exact value of N_PC. Otherwise, the literal value of N_PC is decoded relatively to N_MAX in the case of the symbol LITERAL_PREDICTION or relatively to N_C in the case of the symbol SHORT_PREDICTION, during a step 570.

Further to one of the steps 540, 560 and 570, the value of N_MAX may possibly be updated, during a step 580. This updating is carried out in similar manner to the updating carried out on coding of the symbols by the coder. The decoding method then ends during a step 590.

FIG. 6 shows a device or coder, 600, of the present invention, and different peripherals adapted to implement the present invention. In the embodiment illustrated in FIG. 6, the device 600 is a micro-computer of known type connected, via an input card 604, to a means for acquisition or storage of hierarchized data organized into a plurality of events, for example at least one XML document.

The device 600 comprises a communication interface 618 connected to a network 634 able to transmit, as input, data to code or decode and/or, as output, data coded or decoded by the device. The device 600 also comprises a storage means 612, for example a hard disk, and a drive 614 for a diskette 616. The diskette 616 and the storage means 612 may contain data to code or decode, coded or decoded data and a computer program adapted to implement the method of the present invention.

According to a variant, the program enabling the device to implement the present invention is stored in ROM (acronym for "read only memory") 606. In another variant, the program is received via the communication network 634 before being stored.

This same device 600 has a screen 608 for viewing the data to be to coded or decoded or for serving as an interface with the user for parameterizing certain operating modes of the device 600, using a keyboard 610 and/or a mouse for example.

A CPU (acronym for "central processing unit") 603 executes the instructions of the computer program and of programs necessary for its operation, for example an operating system. On powering up of the device 600, the programs stored in a non-volatile memory, for example the read only memory 606, the hard disk 612 or the diskette 616, are transferred into a random access memory RAM 608, which will then contain the executable code of the program implementing the method of the present invention as well as registers for storing the variables necessary for its implementation.

Naturally, the diskette 616 may be replaced by any type of removable information carrier, such as a compact disc, memory card or key. More generally, an information storage means, which can be read by a computer or by a microprocessor, integrated or not into the device, and which may possibly be removable, stores a program implementing the coding method of the present invention. A communication bus 662 affords communication between the different elements included in the device 600 or connected to it. The representation, in FIG. 6, of the bus 662 is non-limiting and in particular the central processing unit 603 unit may communicate instructions to any element of the device 600 directly or by means of another element of the device 600.

The invention claimed is:

1. A method of coding a structured document, comprising:
    a step of determining whether a succession of correct predictions exists for items of a set of items of the document,
    if the result of said determining step is positive, a step of coding the number of successive correct predictions, and
    a step of updating at least one prediction on the basis of the items of the document.

2. A method according to claim 1, further comprising, during the step of determining whether a succession of correct predictions exists, for each item of said set of items:
    a step of determining whether at least one applicable prediction exists, and
    if yes, a step of determining whether said applicable prediction is correct.

3. A method according to claim 2, wherein, for each item of said set of items, if at least one applicable prediction exists and if no applicable prediction is correct, the structure of said item is coded, the number of successive correct predictions is coded, and the number of successive correct predictions is reinitialized.

4. A method according to claim 2, wherein, for each item of said set of items, if no applicable prediction exists, the structure of said item is coded without reinitializing the number of successive correct predictions.

5. A method according to claim 2, wherein, during the step of determining whether at least one applicable prediction exists, for each item of said set of items, use is made, for a production corresponding to said item, of a number of correct predictions and a number of incorrect predictions, and if the number of incorrect predictions for said production is greater than a predetermined value, said prediction is modified.

6. A method according to claim 2, wherein, during the step of determining whether at least one applicable prediction exists, for each item of said set of items, use is made, for a production corresponding to said item, of a number of correct predictions and a number of incorrect predictions, and if the number of incorrect predictions for said production is greater than a predetermined value, no applicable prediction exists for said item.

7. A method according to claim 2, wherein, for each item of said set of items, if a plurality of applicable predictions exists and if one of the applicable predictions is correct, an identifier of the correct applicable prediction is coded.

8. A method according to claim 1, wherein, during the step of determining whether a succession of correct predictions exists for items of said set of items of the document, use is made of at least one invariable prediction for said items of the set of items of the document.

9. A method according to claim 1, further comprising, if a part of the items of the set of items of the document possesses associated values, a step of coding said values associated with said part of the set of items of the document.

10. A method according to claim 9, further comprising, during the step of coding associated values, a step of storing, in memory, the values associated with said part of the set of items of the document.

11. A method according to claim 1, wherein, during the coding step, for each correct prediction, pieces of information which are not predicted are coded and stored in a buffer memory.

12. A method according to claim 11, wherein, during the coding step, it is determined whether the size of the buffer memory is sufficient to store the new coded data and, if not, the data stored in the buffer memory and the number of successive correct predictions are coded.

13. A method according to claim 1, wherein, during the coding step, use is made of a maximum number of correct predictions and when the number of successive correct predictions reaches said maximum number, said maximum number is coded.

14. A method according to claim 13, further comprising a step of updating said maximum number as a function of the number of times that this maximum number is reached.

15. A method according to claim 1, wherein, during the step of determining whether a succession of correct predictions exists for items of at least one set of items of the document, a prediction of the indexing of the values of the items is made, and a structure prediction for the items is also made.

16. A method according to claim 1, wherein said structured document is in XML language.

17. A method according to claim 1, wherein, during the coding step, data are coded in Efficient XML format, each prediction being made on the basis of an EXI grammar (EXI being an acronym for "Efficient XML Interchange").

18. A method according to claim 1, wherein, during the coding step, data are coded in the Fast Infoset format, each prediction being made on the basis of Fast Infoset tables.

19. A computer program stored on a non-transitory computer-readable memory medium, said program containing instructions which when loaded into a computer system cause the computer system to implement a method according to claim 1.

20. A non-transitory removable or non-removable carrier for computer or microprocessor readable information, storing instructions of a computer program that implement the method according to claim 1.

21. A method according to claim 5, wherein the predetermined value is a function of the number of correct predictions for said production.

22. A method according to claim 6, wherein the predetermined value is a function of the number of correct predictions for said production.

23. A method of decoding a structured document, comprising:
- a step of decoding a number of correct successive predictions,
- a step of predicting structural information for each correctly predicted item of the document by using said number of successive correct, and
- a step of decoding structural information of each non-predicted item of the document,
- wherein, during decoding of a correctly predicted value of an item of the document, it is determined whether a plurality of applicable predictions exists, and, if yes, it is determined whether a prediction identifier has been coded and, if yes, said item is decoded on the basis of the prediction identified by said identifier.

24. A method according to claim 23, wherein, during the step of determining whether at least one applicable prediction exists, use is made, for a production corresponding to said item, of a number of correct predictions and a number of incorrect predictions, and if the number of incorrect predictions for said production is greater than a predetermined value, said prediction is modified.

25. A method according to claim 24, wherein the predetermined value is a function of the number of correct predictions for said production.

26. A method according to claim 23, wherein, during the step of determining whether at least one applicable prediction exists, use is made, for a production corresponding to said item, of a number of correct predictions and a number of incorrect predictions, and if the number of incorrect predictions for said production is greater than a predetermined value, no applicable prediction exists for said item.

27. A method according to claim 26, wherein the predetermined value is a function of the number of correct predictions for said production.

28. A method according to claim 23, wherein, during the step of decoding the number of correct successive predictions, use is made of a maximum number of correct predictions, and further comprising a step of updating said maximum number as a function of the number of times that maximum number is reached.

29. A method according to claim 23, further comprising a step of decoding the value of each correctly predicted item of the document, during which a prediction of the indexing of the values of the items is made and a structure prediction for the items is also made.

30. A device for coding a structured document, comprising:
- a means for determining whether a succession of correct predictions exists for items of a set of items of the document,
- a coding means, if the result of said determining is positive, for coding the number of successive correct predictions, and
- an updating means for updating at least one prediction on the basis of the items of the document.

31. A device for decoding a structured document, comprising:
- a means for decoding a number of correct successive predictions,
- a means for predicting structural information for each correctly predicted item of the document, by using said number of successive correct predictions, and
- a means for decoding structural information of each non-predicted item of the document,
- wherein, during decoding of a correctly predicted value of an item of the document, it is determined whether a plurality of applicable predictions exists, and, if yes, it is determined whether a prediction identifier has been coded and, if yes, said item is decoded on the basis of the prediction identified by said identifier.

* * * * *